(12) United States Patent
Jaklitsch

(10) Patent No.: US 8,675,183 B1
(45) Date of Patent: Mar. 18, 2014

(54) METHOD AND APPARATUS FOR TARGET RANGE DETERMINATION

(75) Inventor: James J. Jaklitsch, Parkton, MD (US)

(73) Assignee: AAI Corporation, Hunt Valley, MD (US)

( * ) Notice: Subject to any disclaimer, the term of this patent is extended or adjusted under 35 U.S.C. 154(b) by 678 days.

(21) Appl. No.: 12/700,714

(22) Filed: Feb. 4, 2010

Related U.S. Application Data

(60) Provisional application No. 61/156,280, filed on Feb. 27, 2009.

(51) Int. Cl.
*G01C 3/22* (2006.01)
(52) U.S. Cl.
USPC ............... 356/21; 356/20; 356/22; 356/5.01
(58) Field of Classification Search
USPC .................... 356/20, 21, 22, 5.01
See application file for complete search history.

(56) References Cited

U.S. PATENT DOCUMENTS

| | | | | |
|---|---|---|---|---|
| 3,684,376 | A * | 8/1972 | Lessard | 356/21 |
| 3,819,267 | A * | 6/1974 | Kawahara | 356/21 |
| 3,999,853 | A * | 12/1976 | Landon | 356/21 |
| 4,016,654 | A * | 4/1977 | Tepedino | 33/277 |
| 4,044,377 | A * | 8/1977 | Bowerman | 348/136 |
| 4,231,162 | A * | 11/1980 | Button | 33/284 |
| 4,389,791 | A * | 6/1983 | Ackerman | 42/122 |
| 4,405,940 | A * | 9/1983 | Woolfson et al. | 348/170 |
| 4,476,494 | A * | 10/1984 | Tugaye | 348/208.6 |
| 4,531,052 | A * | 7/1985 | Moore | 235/404 |
| 4,647,193 | A * | 3/1987 | Rosenfeld | 356/4.04 |
| 4,777,352 | A * | 10/1988 | Moore | 235/404 |
| 4,787,739 | A * | 11/1988 | Gregory | 356/4.03 |
| 4,953,972 | A * | 9/1990 | Zuk | 356/4.07 |
| 5,020,902 | A * | 6/1991 | Kits van Heyningen et al. | 356/21 |
| 5,305,092 | A * | 4/1994 | Mimura et al. | 356/609 |

(Continued)

FOREIGN PATENT DOCUMENTS

| | | |
|---|---|---|
| CA | 2573421 A1 | 7/2007 |
| GB | 2300082A A | 10/1996 |

(Continued)

OTHER PUBLICATIONS

Cabib D. et al., "Controllable Time Dependent and Dual Band Emission Infrared Source to Test Missile Warning Systems in Flight," Proceedings of SPIE—The International Society for Optical Engineering—Electro-Optical and Infrared Systems: Technology and Applications V., vol. 7113, 2008.

(Continued)

*Primary Examiner* — Isam Alsomiri
*Assistant Examiner* — Assres H Woldemaryam
(74) *Attorney, Agent, or Firm* — Venable LLP; Jeffri A. Kaminski; Todd R. Farnsworth

(57) ABSTRACT

A system, method and computer program product provides for estimating the range of a target. An acquisition window of an imaging device is adjusted to fit a target at an unknown range in response to a user input. An angle subtended by the largest dimension of the target viewed from the acquisition window is determined. The range of the target is estimated from a largest dimension of the target and the angle subtended by the largest dimension of the target. The device may be a man-portable aircraft survivability equipment (ASE) system trainer (MAST), or any simulator simulating a man-portable air defense system (MANPADS).

23 Claims, 7 Drawing Sheets

(56) References Cited

U.S. PATENT DOCUMENTS

| | | | |
|---|---|---|---|
| 5,317,374 A * | 5/1994 | Lister | 356/3 |
| 5,341,142 A * | 8/1994 | Reis et al. | 342/64 |
| 5,483,336 A * | 1/1996 | Tocher | 356/3.15 |
| 5,616,903 A | 4/1997 | Springer | 235/414 |
| 5,867,256 A | 2/1999 | Van Rheeden | 356/4.03 |
| 6,476,943 B1 * | 11/2002 | Yertoprakhov | 359/15 |
| 6,491,253 B1 * | 12/2002 | McIngvale | 244/3.11 |
| 6,583,860 B2 * | 6/2003 | Haga | 356/3.01 |
| 6,615,531 B1 * | 9/2003 | Holmberg | 42/142 |
| 6,636,296 B1 * | 10/2003 | Faulkner et al. | 356/21 |
| 6,650,235 B2 * | 11/2003 | Shirai et al. | 340/435 |
| 6,963,376 B2 * | 11/2005 | Nakamura | 348/345 |
| 7,477,400 B2 * | 1/2009 | Gutierrez et al. | 356/609 |
| 7,916,278 B2 * | 3/2011 | Smith | 356/4.01 |
| 7,949,244 B2 * | 5/2011 | Huang | 396/89 |
| 8,169,598 B2 * | 5/2012 | Huang et al. | 356/4.01 |
| 2002/0075471 A1 * | 6/2002 | Holec | 356/3.01 |
| 2005/0088641 A1 * | 4/2005 | Hung et al. | 356/4.02 |
| 2005/0177307 A1 * | 8/2005 | Greenfeld et al. | 701/220 |
| 2005/0280802 A1 * | 12/2005 | Liu | 356/5.01 |
| 2007/0129853 A1 * | 6/2007 | Greenfeld et al. | 701/3 |
| 2007/0273765 A1 * | 11/2007 | Wang et al. | 348/152 |
| 2008/0169423 A1 * | 7/2008 | Betschart et al. | 250/372 |
| 2008/0191926 A1 * | 8/2008 | Benayahu et al. | 342/52 |

FOREIGN PATENT DOCUMENTS

| | | |
|---|---|---|
| GB | 2400644 A | 10/2004 |
| JP | 61076908A A | 4/1986 |
| WO | WO-9722230 A1 | 6/1997 |

OTHER PUBLICATIONS

European Search Report, issued in related EP10154769, completed Jun. 18, 2010.

* cited by examiner

METHOD AND APPARATUS FOR TARGET RANGE DETERMINATION

CROSS REFERENCE TO RELATED APPLICATIONS

This application claims the benefit of U.S. Provisional Application No. 61/156,280, filed Feb. 27, 2009, entitled "Method and Apparatus for Target Range Determination," to James Joseph Jaklitsch, the contents of which are incorporated herein by reference in their entirety.

BACKGROUND

1. Field

Exemplary embodiments relate generally to missile warning systems, and more particularly to aircraft survivability training systems.

2. Related Art

With advances in missile technology, in recent years missile weapons have demonstrated the ability to unleash tremendous devastation against aircraft. Portable shoulder launch systems, part of the broader category of man portable air defense systems that fire surface to air missiles, have provided a proven threat to aircraft safety.

In turn, sophisticated defense mechanisms have been concurrently developed for targeted aircraft and other vehicles. Defensive capability includes the ability to detect approaching missiles as well as the ability to enact defensive countermeasures. In large part, the detection is performed by electro-optical missile warning sensors. These sensors detect the radiant energy of the missile plume, typically in the ultra-violet and infra-red portions of the electromagnetic spectrum.

In field exercises, in place of portable missile launch systems, simulation devices may be used to invoke a similar response by aircraft defense systems. For example, a simulation device will be used to track and lock the enemy aircraft, and in place of actual missiles, transmit electro-optical energy in the ultra-violet and infra-red portions of the electromagnetic spectrum.

However, the engagement ranges required between the simulators, simulating missile launching systems, and the aircraft being targeted, can vary from 0.5 kilometers to 5 kilometers, or even larger separations. This makes it quite difficult to accurately target the aircraft. Known laser range finder and stimulus profile techniques have proven ineffective as well. What is required is a method and system that compensates for these disadvantages to solve the foregoing problems specifically, and improve the state of technology for missile warning systems generally.

SUMMARY

In an exemplary embodiment a method for estimating the range of a target is provided, and includes: adjusting an acquisition window of an imaging device to fit a target at an unknown range in response to a user input; determining an angle subtended by the largest dimension of the target viewed from the acquisition window; and estimating the range of the target from a largest dimension of the target and the angle subtended by the largest dimension of the target viewed from the acquisition window.

The acquisition window may be a square having dimension (D) in pixels in the azimuthal direction and dimension (D) in pixels in the elevation direction on a graphical user interface (GUI). The acquisition window on the GUI may expand at a non-linear rate in response to the user input.

The dimension (D) may equal $Dmin+R0 \cdot T+0.5 \cdot \alpha \cdot T^2$, where (a) Dmin is the initial half-width of the window, in pixels, (b) R0 is the initial rate of expansion of the acquisition window, in pixels per second, (c) $\alpha$ is the acceleration of expansion of the acquisition window, in pixels per second squared, and T is the time, in seconds, the user actuates a control to generate the user input.

The angle subtended by the largest dimension of the target may be based on the dimension (D) in pixels of the acquisition window and a pixel weight being a subtended angle for each of the pixels representing a function of the relevant zoom state of the imaging device. The angle subtended by the largest dimension of the target ($\theta$) may equal $2 \cdot D \cdot P$, where dimension D is the dimension in pixels of the acquisition window, and P is the pixel weight.

In an exemplary embodiment, the largest dimension of the target may be predetermined. In another exemplary embodiment, the largest dimension of the target may be determined in real-time.

The range may be estimated by dividing the largest dimension of the target by the angle subtended by the largest dimension of the target.

The method may further include selecting a hypothetical stimulus profile of a missile to be launched based on the estimating of the range of the target. The stimulus profile may include (a) an amplitude representing emission characteristics of the missile as a function of (b) the amount of time since the launching of the missile.

In an exemplary embodiment, the method may further include locking the imaging device onto the target. The locking of the imaging device onto the target may be computed from an average foreground pixel intensity level of the acquisition window and an average background pixel intensity level outside the acquisition window.

The method may further include: (a) computing the average foreground pixel intensity level as the average intensity level of the plurality of pixels within the acquisition window; (b) computing the average background pixel intensity level as the average intensity level of any number of pixels outside the acquisition window; (c) computing a contrast ratio by dividing the average foreground pixel intensity level by the average background pixel intensity level; and (d) determining the target to be locked if the contrast ratio exceeds a predetermined threshold level.

In an exemplary embodiment, a system is provided for estimating the range of a target, and includes: a device for adjusting an acquisition window of an imaging device to fit a target at an unknown range in response to a user input; a device for determining an angle subtended by the largest dimension of the target viewed from the acquisition window; and a device for estimating the range of the target from a largest dimension of the target and the angle subtended by the largest dimension of the target viewed from the acquisition window.

The acquisition window may be a square having dimension (D) in pixels in the azimuthal direction and dimension (D) in pixels in the elevation direction on a graphical user interface (GUI).

The angle subtended by the largest dimension of the target may be based on the dimension (D) in pixels of the acquisition window and a pixel weight being a subtended angle for each of the pixels representing a function of the relevant zoom state of the imaging device. The angle subtended by the largest dimension of the target ($\theta$) may equal $2 \cdot D \cdot P$, where dimension D is the dimension in pixels of the acquisition window, and P is the pixel weight. The range is estimated by dividing the largest dimension of the target by the angle subtended by the largest dimension of the target.

In an exemplary embodiment, the system may further include selecting a hypothetical stimulus profile of a missile to be launched based on the estimating of the range of the target. The stimulus profile may include (a) an amplitude representing emission characteristics of the missile as a function of (b) the amount of time since the launching of the missile.

In an exemplary embodiment, the system may further include a device for locking the imaging device onto the target. The locking of the imaging device onto the target may be computed from an average foreground pixel intensity level of the acquisition window and an average background pixel intensity level outside the acquisition window.

The system may further include (a) a device for computing the average foreground pixel intensity level as the average intensity level of the plurality of pixels within the acquisition window; and (b) a device for computing the average background pixel intensity level as the average intensity level of any number of pixels outside the acquisition window.

In an exemplary embodiment, the system further includes: (c) a device for computing a contrast ratio by dividing the average foreground pixel intensity level by the average background pixel intensity level. In an exemplary embodiment, the system further includes: (d) a device for determining the target to be locked if the contrast ratio exceeds a predetermined threshold level.

The system may also further include a device for transmitting electro-optical energy having characteristics emulating a missile threat signature. The system may include at least one of: a man-portable aircraft survivability equipment (ASE) system trainer (MAST); and a simulator simulating a man-portable air defense system (MANPADS).

In an exemplary embodiment, a machine-readable medium is provided, that provides instructions, which when executed by a computing platform, causes the computing platform to perform certain operations. The operations may include a method for estimating the range of a target. The method may include: adjusting an acquisition window of an imaging device to fit a target at an unknown range in response to a user input; determining an angle subtended by the largest dimension of the target viewed from the acquisition window; and estimating the range of the target from a largest dimension of the target and the angle subtended by the largest dimension of the target viewed from the acquisition window.

Further features and advantages of, as well as the structure and operation of, various embodiments, are described in detail below with reference to the accompanying drawings.

BRIEF DESCRIPTION OF THE DRAWINGS

The foregoing and other features and advantages of the invention will be apparent from the following, more particular description of exemplary embodiments of the invention, as illustrated in the accompanying drawings. In the drawings, like reference numbers generally indicate identical, functionally similar, and/or structurally similar elements. The drawing in which an element first appears is indicated by the leftmost digits in the corresponding reference number. A preferred exemplary embodiment is discussed below in the detailed description of the following drawings.

DETAILED DESCRIPTION OF EMBODIMENTS OF THE EMBODIMENTS

Various exemplary embodiments are discussed in detail below including a preferred embodiment. While specific implementations are discussed, it should be understood that this is done for illustration purposes only. A person skilled in the relevant art can recognize that the systems, methods and features provided herein may be used without parting from the spirit and scope of the invention. Furthermore, any and all references cited herein shall be incorporated herein by reference in their respective entireties.

Exemplary Embodiments

Figure 1:
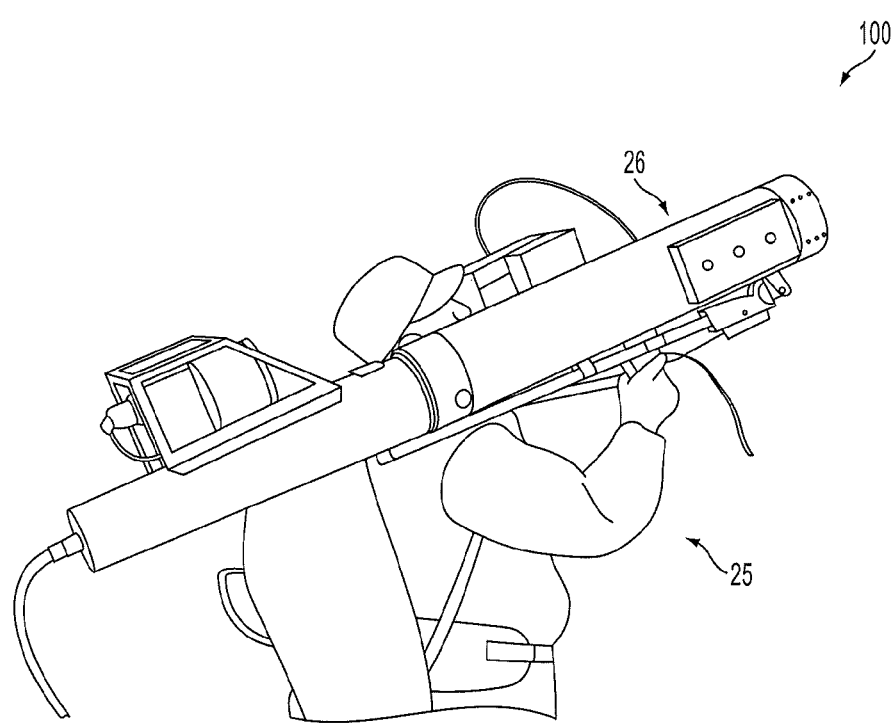
FIG. 1 depicts an exemplary environment using a man-portable aircraft-survivability-equipment system trainer in accordance with exemplary embodiments.

FIG. 1 illustrates exemplary environment 100. Exemplary environment 100 includes an individual 25 and man-portable aircraft-survivability-equipment (ASE) system trainer, or MAST 26. For example, the individual 25 may be a combat soldier or other individual using MAST 26.

In an exemplary embodiment, MAST 26 is a device designed for use in force-on-force military training exercises. For example, the device may replicate the approximate visual characteristics of a portable air defense system.

An exemplary portable air defense system is a man-portable air defense system (MANPADS). MAST 26 may simulate, for example, the MANPADS firing a surface-to-air-missile (SAM), as launched by a member of an opposing force (OPFOR). In certain embodiments herein, MAST 26 may be referred to as a simulated MANPADS 26.

In an exemplary embodiment, the missile is simulated by radiating energy in the ultra-violet (UV) and/or Infra-Red (IR) portions of the electromagnetic spectrum, for example, from the ground up to a real aircraft flying on a live training range. The radiated energy may be controlled, for example, amplitude modulated, in time, so as to replicate the missile-plume signature characteristics, for example the threat profile, that would have appeared if the aircraft had been engaged by an actual MANPADS missile. In an exemplary embodiment, the radiated energy may be detected by electro optical (EO) missile warning sensors on board the aircraft.

In an exemplary embodiment, the aircraft missile warning sensors may detect the EO energy, as radiated up from the ground-based missile simulator, and analyze its amplitude-time characteristics. This may be performed to determine if it is the signature of an actual missile, based on confidence thresholds. If there is sufficient confidence that the radiated EO energy is representative of an actual missile, a missile-launch event may be "declared", causing countermeasures (for example, flares) to automatically deploy, and giving the pilot visual and audio warnings to initiate evasive action.

In an exemplary embodiment, in order to get the on-aircraft missile warning system to "declare" a launch event, the simulated weapon may replicate the missile plume signature characteristics to a high degree of fidelity. For example, the missile warning systems may employ sophisticated algorithms to discriminate actual threat profiles from false alarms, with the result that the simulated threat profile must very closely match the threat profile from an actual missile in order to be successful.

In certain embodiments, an operational issue may arise because, in the training exercise, a simulated MANPADS, for example man-portable aircraft survivability trainer 26, is at a fixed point on the earth, and not firing a real missile, closing on the target aircraft. In one exemplary embodiment, the engagement ranges for the training exercises can vary between 0.5 Km to 5 Km, for example, and it may be exceptionally difficult to develop a single stimulus profile that will cause consistent launch declaration over such a wide range.

To deal with the problem, in an exemplary embodiment, a laser range finder (LRF) may be included on MAST 26 to attempt to measure the range to the target and select a stimulus profile appropriate to that range. In one embodiment, a single stimulus profile may also be developed that will work over the full span of engagement ranges.

In an exemplary embodiment, the use of the LRF may provide limitations for one or more reasons. For example, in one embodiment, it may be difficult to get a LRF range measurement off a maneuvering aircraft at extended ranges, unless perhaps a tripod is used to stabilize the weapon, which may or may not be not desired. Also, in one embodiment many aircraft may carry laser warning systems which could be triggered by the LRF. This may provide the pilot with unrealistic advanced warning of pending engagement, or unrealistic "negative" training.

In an exemplary embodiment, the use of a single stimulus profile may provide limitations for one or more reasons. For example, in one embodiment, a composite profile may be developed that may comprise several different range-dependent stimulus profiles strung together. In an exemplary embodiment, the time-lines may become excessive, and rate of successful "declaration" may not be adequate.

In certain embodiments, a MAST 26 is provided that is easy to use, authentic in its representation of the capabilities of actual MANPADS threats, and capable of reliable, free-standing engagement, for example, from ranges of 0.5 Km to 5.0 Km. In exemplary embodiments, a number of characteristics may be provided. First, for example, may be the inclusion of a virtual seeker that emulates the IR and/or UV target acquisition characteristics of a real MANPADS threat system. Second, for example, may be the use of a virtual seeker acquisition window to passively estimate the range to a target aircraft. Third, for example, may be the ability to automatically select the correct range-dependent stimulus profile from a set of possibilities (short range, medium range, long range, etc.) on the basis of the passive range estimate.

The above approach may have several advantages. First, it may avoid the use of a laser range finder during engagement scenarios. The engagement scenario may be, for example, completely passive. There may, for example, be no requirement to radiate electromagnetic energy prior to the firing of a stimulus that emulates an exemplary missile.

Second, it may closely represent the acquisition characteristics of an actual MANPADS system. The use of a virtual seeker may require there to be sufficient contrast, for example IR and/or UV, for a seeker to acquire, before the simulated weapon can be launched. This restriction may prevent the OPFOR weapon operator from gaining an unrealistic advantage by being able to fire when a real weapon would not be able to do so.

Also, the passive ranging and automatic selection of the appropriate stimulus profile may be keyed to an exemplary virtual seeker acquisition in a manner that may be essentially transparent to the operator. In this example, as soon as the OPFOR weapon operator may achieve a lock condition with the virtual seeker, the operator may pull the trigger and fire the weapon. In one or more exemplary embodiments specified here, the stimulus profile refers to an amplitude representing emission characteristics of a missile as a function of the amount of time since the launching of the missile. Separate stimulus profiles may be derived for differing missile ranges, which may be provided in units of kilometers. In an exemplary embodiment, the appropriate profile may be automatically selected, with the result that the weapon may provide seamless operation over, but not limited to, for example, a 0.5 to 5 kilometer engagement range.

Figure 2:
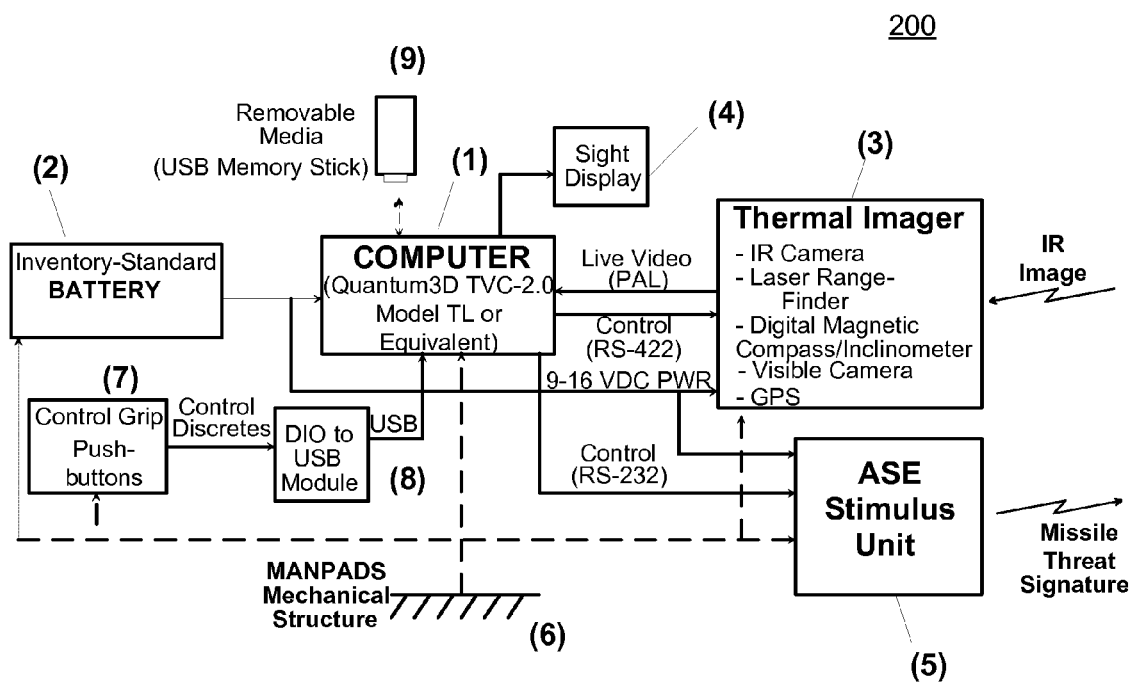
FIG. 2 depicts an exemplary functional block diagram of a man-portable aircraft-survivability-equipment trainer in accordance with exemplary embodiments.

FIG. 2 illustrates an exemplary functional block diagram 200. In an exemplary embodiment, functional block diagram 200 is a functional block diagram of a MAST 26. Diagram 200 includes computer 1, battery 2, thermal imager 3, sight display 4, ASE stimulus unit 5, MANPADS structure 6, control grip push buttons 7, DIO to USB module 8, and removable media 9. The following description provides an exemplary illustration, as the illustrated elements may have any additional features and functions.

Computer 1 serves as the central processor of MAST 26. It is powered by a standard Battery 2, which also powers thermal imager 3 and an ASE stimulus unit 5.

In an exemplary embodiment, computer 1 may be a small tactical computer, for example on the order of 1.7 lbs. It may be fully ruggedized and optimized to provide video processing for soldiers in the field. The computer remotely controls the ASE stimulus unit 5 and the thermal imager 3, and records the video feed from the thermal imager 3 into standard media file formats, such as for example MS Windows media files, which may be subsequently transferred, for example, onto a USB memory stick 9 for playback. The playback may be performed after the sequence of actions, or after-action review (AAR).

In an exemplary embodiment, thermal imager 3 is an integrated day/night camera and data acquisition system. It may include integral GPS and digital compass/inclinometer capability, as well as laser range finder (LRF) capability. It incorporates a cooled, dual field-of-view (FOV) infrared (IR) thermal imager (for example, wide and narrow FOV), with a parallel visible color daylight camera. Live video from the thermal imager 3 may be overlaid with symbology data, applied by computer 1, and displayed to the operator on a monocular sight display 4. The sight display 4 may facilitate aiming MAST 26, and allow the operator to see the video that is being recorded.

In an exemplary embodiment, ASE stimulus unit 5 may radiate electro-optical (EO) energy with wavelength and amplitude-time characteristics that emulate missile threat signatures (MST). In training scenarios, the EO energy (for example, the missile threat signature) is radiated from the ground-based MAST 26 to aircraft in flight over the training range, with the objective of causing the Aircraft Survivability Equipment (ASE), or missile warning receivers onboard the aircraft, to declare that a missile has been launched.

In an exemplary embodiment, one or more of the operator controls are required during an engagement scenario (for example, begin video record, FOV select, IR/visible mode select, stimulus trigger, end video record, etc.) and are capable of being activated by the operator using a control grip 7. For example, in an exemplary embodiment, such control does not require an operator to redirect attention from the sighting display 4. The buttons of the control grip 7 may be encoded by a DIO to USB module 8 so that operator button-press events may be read by computer 1.

In an exemplary embodiment, all elements of MAST 26 are integrated onto the MANPADS structure 6, with no tether to a backpack. The structure is a lightweight structural tube, designed to emulate the essential features of a typical MANPADS. The placement of system components is distributed to balance MAST 26, locating the center of gravity as close as possible to a point coaxial with the MANPADS tube, directly above the operator's right shoulder, for example, when the system is in the operating position.

Figure 3A:
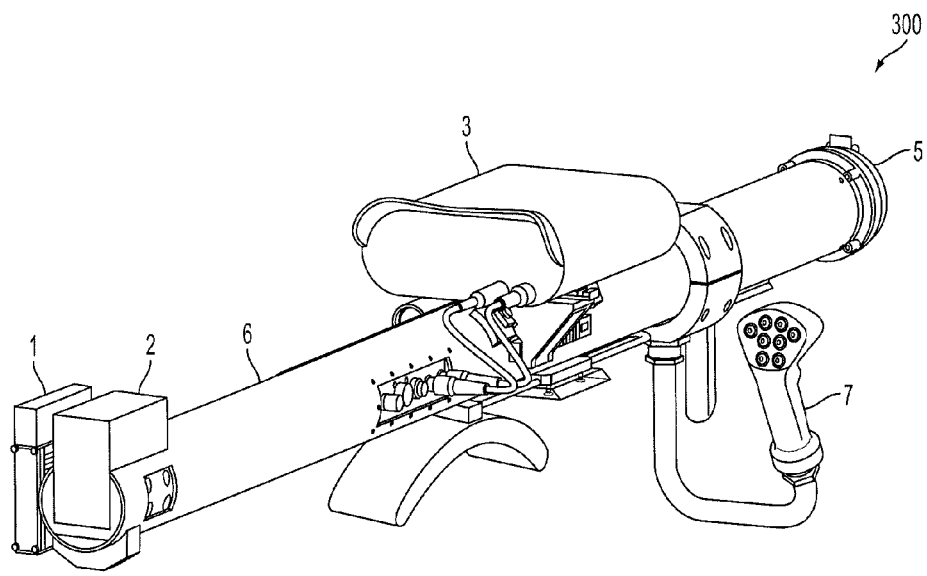
FIGS. 3A and 3B respectively depict exemplary physical layouts of a man-portable aircraft-survivability-equipment trainer in accordance with exemplary embodiments.
Figure 3B:
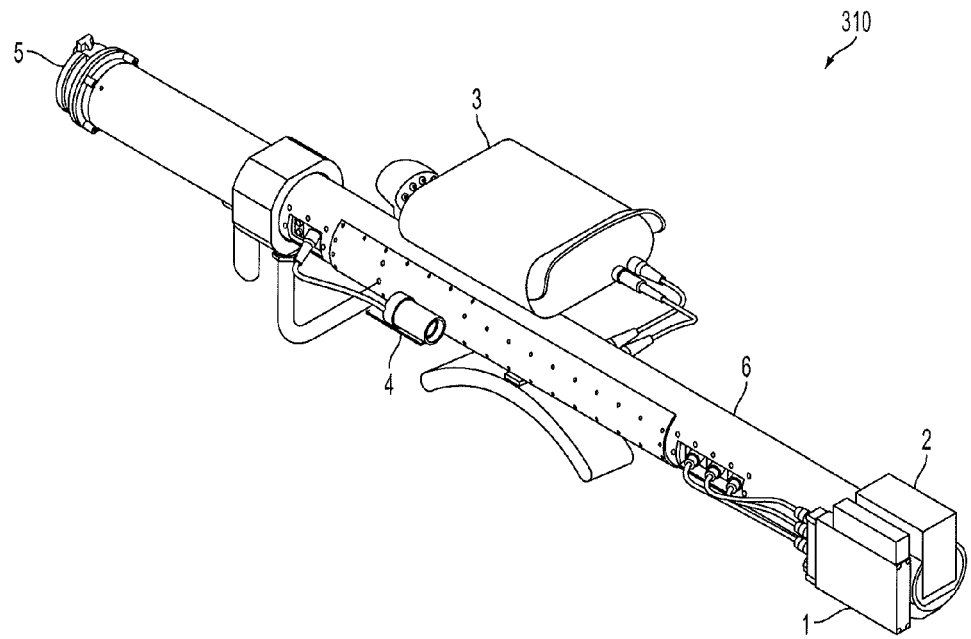

FIG. 3A illustrates an exemplary layout 300 of MAST 26 from a first perspective. FIG. 3B illustrates an exemplary layout 310 of MAST 26 from a second perspective. As shown, in an exemplary embodiment the physical layout of MAST 26 is configured to emulate the physical appearance of a MANPADS weapon system.

In the illustrated exemplary embodiment, layouts 300 and 310 respectively illustrate the location and physical appearance of the computer 1, battery 2, thermal imager 3, sight display 4, ASE stimulus unit 5, MANPADS structure 6, and control grip 7.

Figure 4A:
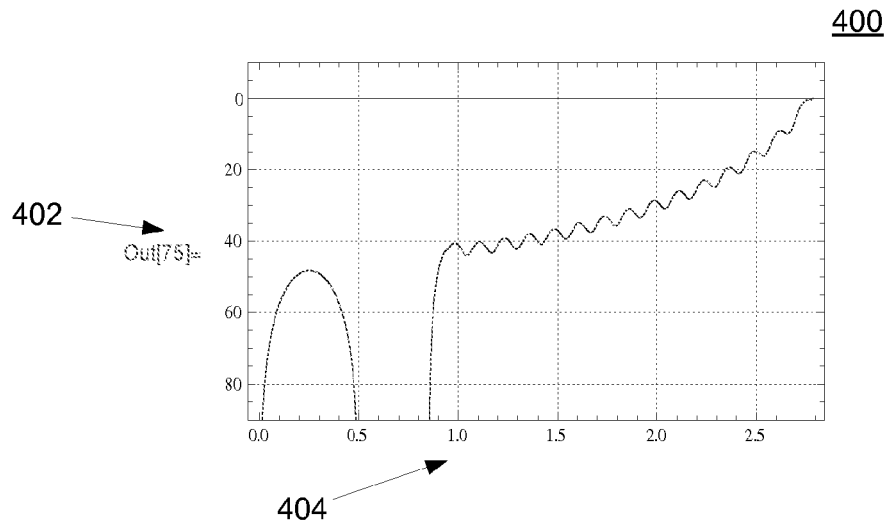
FIGS. 4A, 4B and 4C respectively depict exemplary hypothetical stimulus profiles for exemplary missiles fired at one kilometer, three kilometer and five kilometer ranges in accordance with exemplary embodiments.
Figure 4B:
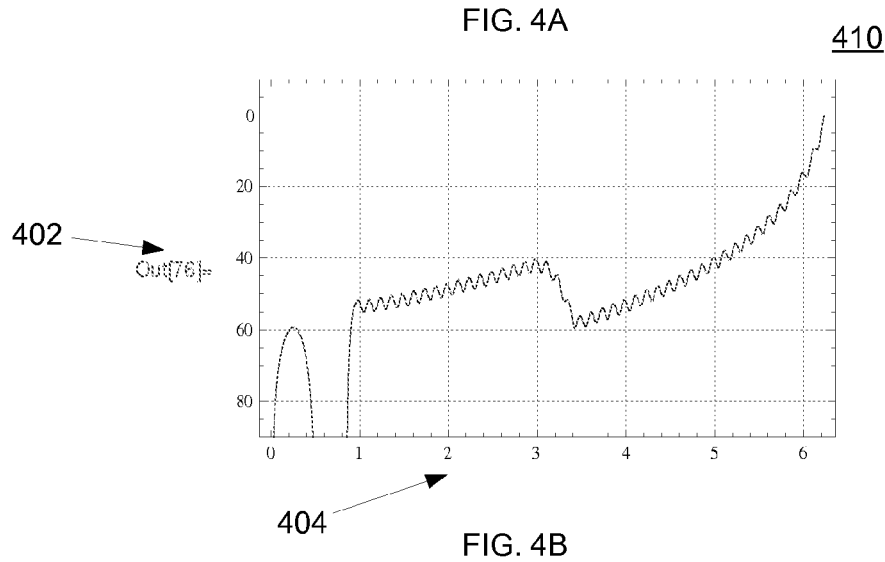
Figure 4C:
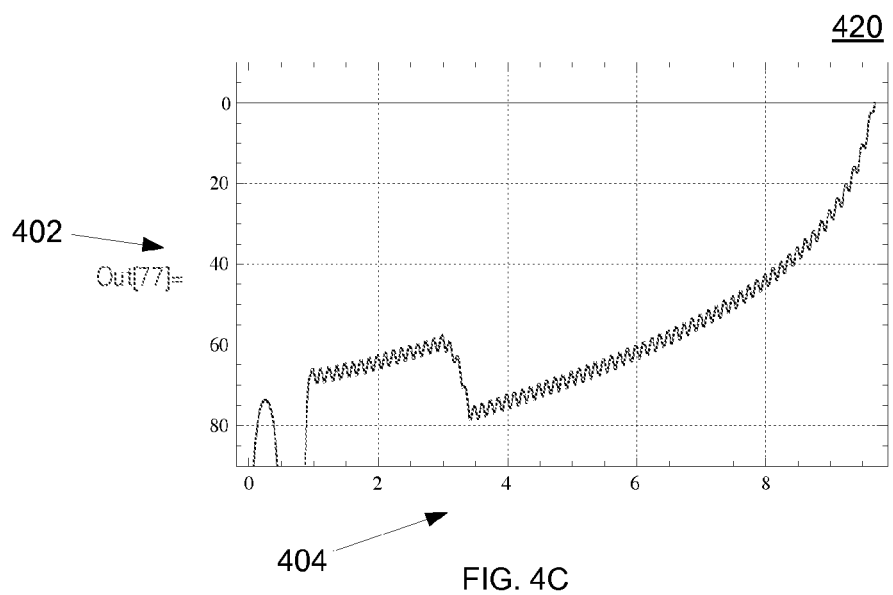

FIG. 4A depicts an exemplary hypothetical stimulus profiles 400 for an exemplary missile fired at a 1 kilometer range in accordance with exemplary embodiments. FIG. 4B depicts an exemplary hypothetical stimulus profiles 400 for an exemplary missile fired at a 3 kilometer range in accordance with exemplary embodiments. FIG. 4C depicts an exemplary hypothetical stimulus profiles 400 for an exemplary missile fired at a 5 kilometer range in accordance with exemplary embodiments.

In one or more such exemplary embodiments, each of stimulus profiles 400-420 provide to an amplitude 402 representing emission characteristics of an exemplary missile as a function of the amount of time 404 (time trace) since the launching of the missile. Separate stimulus profiles 400, 410, 420 may be derived for differing missile ranges, as shown.

In an exemplary embodiment, the stimulus profiles 400-420 are representative amplitude to time traces for ASE stimulus unit 5. Stimulus profiles 400, 410, 420 may be programmable profiles used to emulate missile threat signatures (MSTs) of actual missiles.

In an exemplary embodiment, a fundamental issue may be caused by the range-dependency of the data. As shown in stimulus profiles, the profile data for a missile fired from 1 km (400) may be significantly different from the profile data for a missile fired from 3 km (410), which in turn may be significantly different from the profile data for a missile fired from 5 km (420).

In an exemplary embodiment, a single stimulus profile may not be able to cause consistent declarations in an exemplary missile warning system over a multiplicity of engagement ranges, for example, between 0.5 and 5.0 kilometers. Accordingly, in exemplary embodiments, at least an approximate estimate of the engagement range may be used, and a range-appropriate stimulus profile may be selected for a successful outcome.

Figure 6:
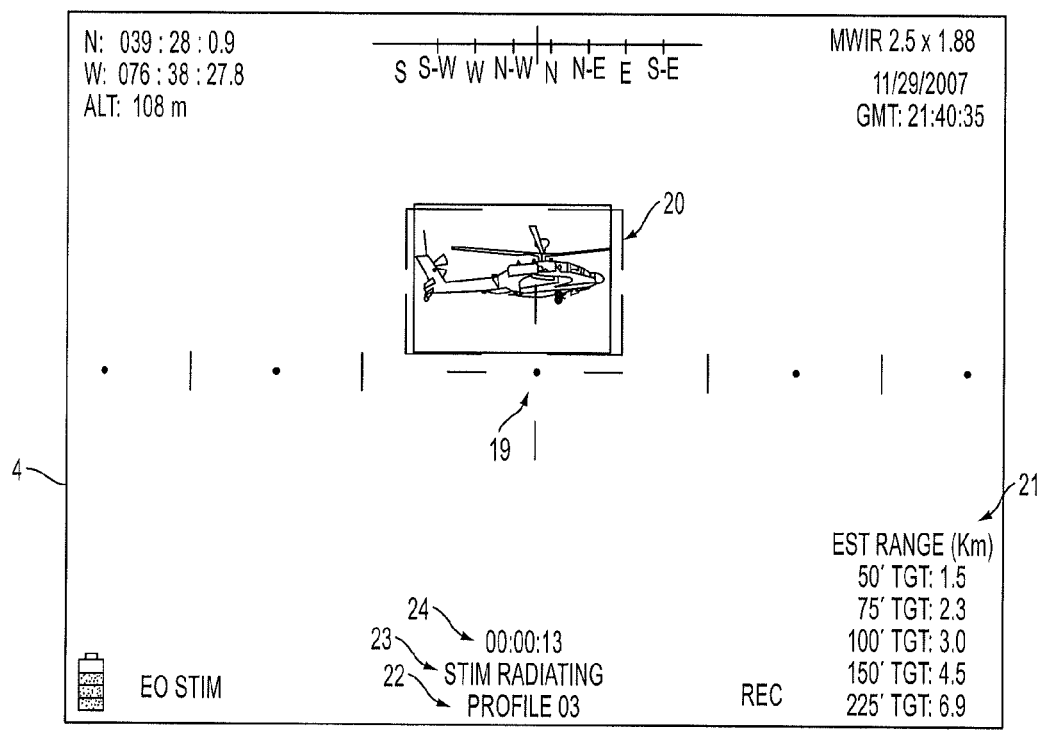
FIG. 6 depicts an exemplary display for an exemplary a man-portable aircraft-survivability-equipment system trainer in accordance with exemplary embodiments.

FIG. 6 illustrates an exemplary implementation of display 4 of MAST 26. Illustrated in the figure are aim-point reticle 19, virtual acquisition window 20, passive range estimation 21, stimulus profile indicator 22, system status indicator 23 and engagement time-line indicator 24. These elements of display 4 may be better understood with respect to the following exemplary embodiments.

In an exemplary embodiment, operation of virtual seeker acquisition window 20 may passively estimate the range to the target, then automatically select the correct stimulus profile 22 from a list of possibilities, based on the estimated range. Each of the candidate profiles 22 (as, for example, illustrated as 400-420) may be optimized for a particular engagement range, and the best choice, for example the closest fit to the estimate engagement range, may be automatically selected when the target is acquired.

Figure 5:
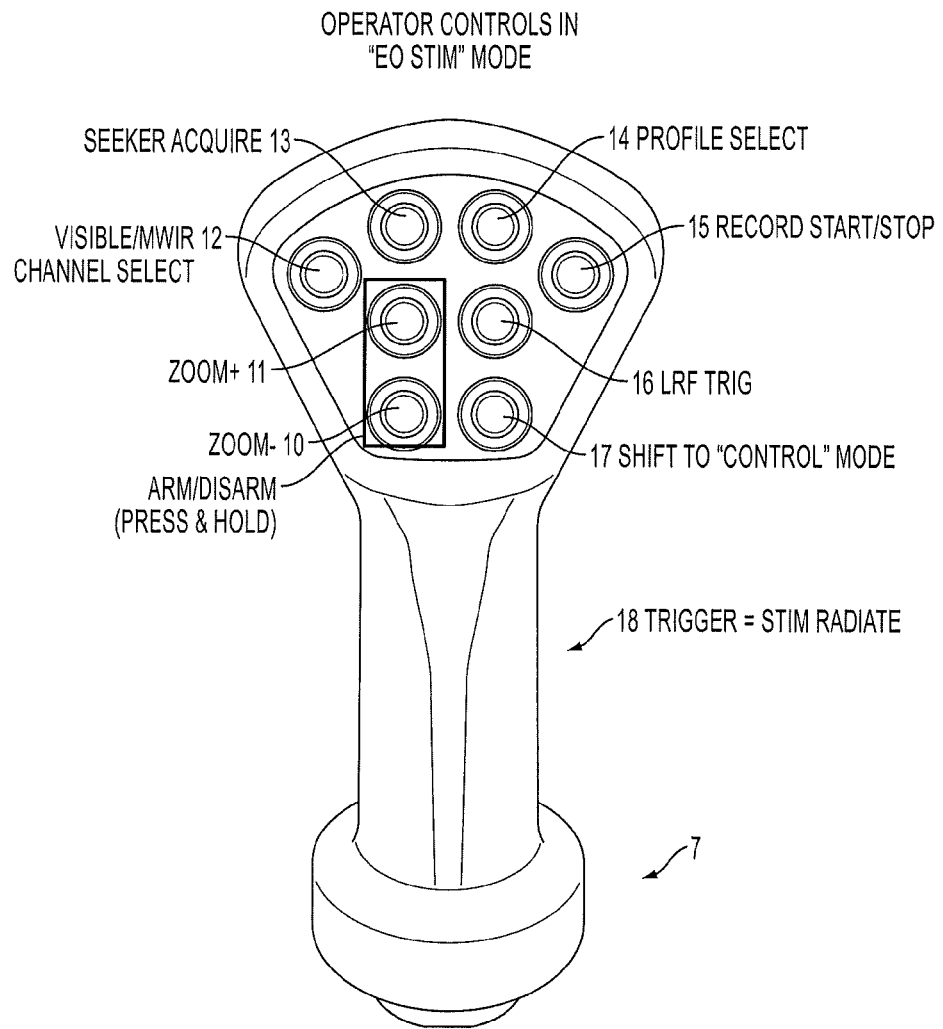
FIG. 5 depicts an exemplary control grip for an exemplary a man-portable aircraft-survivability-equipment system trainer in accordance with exemplary embodiments.

In an exemplary embodiment, the control interface for MAST 26 may be accomplished by means of control grip 7 of MAST 26. FIG. 5 illustrates the features and functions of exemplary control grip 7 in greater detail. In the exemplary embodiment, all the functions necessary for engaging a target and recording a digital movie of the engagement are mapped into the nine momentary push-buttons on grip 7. The Zoom− button 10 and Zoom+ button 11 may control the zoom state of imager 3. When pressed together and held for several seconds, for example, these buttons may control the arming and disarming states (ARM/DISARM) of MAST 26. The channel select button 12 may toggle between the visible and IR channels of imager 3.

In an exemplary embodiment, the seeker acquire button 13 may control the virtual seeker function. Referring to FIG. 6, this button 13, when depressed, may cause virtual acquisition window 20 to appear at the center of the display screen 4 and expand while the button is held. When the button is released, the virtual acquisition window 20 (also called "acquisition gate," or "virtual seeker") may be frozen in size and acquisition contrast and passive ranging calculations may be activated. The profile select button 14 may allow the operator to select a specific stimulus profile, or to enable automatic profile selection. In an exemplary embodiment, options may be selected by scrolling through a pick-list.

The record button 15 may start and stop the video record function, toggling between the two states. The LRF trig button 16 activates the laser range finder (LRF) function, which may be embedded in thermal imager 3. The shift button 17 may toggle the system operating mode between a control mode, which may display configuration menus, and an engagement mode, where video from the thermal imager 3 may be displayed with data overlay. In an exemplary embodiment, the trigger 18 of the control grip 7 may cause the threat signature to be radiated when appropriately enabled.

Turning back to FIG. 6, the operator display 4 in the engagement mode is provided. In an exemplary embodiment, exemplary display 4 is a virtual seeker and passive auto-ranging display. The aim-point reticle 19 is a fixed reticle pattern, aligned with the center of the visual display 4. This reticle may provide an aiming reference for the operator as the operator engages a target with the simulated weapon of MAST 26. MAST virtual acquisition window 20 emulates the acquisition performance of a real missile seeker and simultaneously provides the passive range estimation 21 that enables the optimum stimulus profile to be automatically selected.

In an exemplary embodiment, stimulus profile indicator 22 indicates the selected stimulus profile (for example, scrolled from an available list), or that the memory is empty and/or erased, if no profiles are loaded and/or residing in the memory. In an exemplary automatic selection mode, this indicator may display "automatic" before a target is acquired, but may change to the selected profile as soon as the target has been acquired and the optimum profile has been selected.

In exemplary embodiments, system status indicator 23 indicates the current status of the weapon. In exemplary embodiments, the system status indicator 23 may indicated that the system is ready and unarmed ("ready: unarmed"), ready and armed ("ready: armed"), radiating EO energy or another stimulus ("stim radiating"), or reloading and/or timed out ("reloading timeout").

In an exemplary embodiment, engagement time-line indicator 24 displays a running clock referenced to the start of threat emission. This field may be blank prior to firing of the stimulus. The clock may appear when the stimulus trigger is activated, counting upward from zero. The field may also be blanked once again when the clock reaches a time period, for example, 30 seconds.

In an exemplary embodiment, for an actual MANPADS the missile seeker must acquire and lock (LOCK) before the missile can be fired. The LOCK requires that there to be sufficient contrast in the IR spectrum for the MANPADS missile to recognize the target and begin to track it.

Pilots may make use of the lock-on requirement in their defensive countermeasures, deliberately employing tactics which make it difficult for the missile to lock onto their aircraft. Evasive maneuvers may include flying low against a background of trees so that the thermal signature of the treeline prevents a missile from getting a clear target.

Thus, in this exemplary embodiment, it is important for MAST 26 to emulate the seeker performance of an actual MANPADS. Otherwise, the MAST operator would gain an unfair tactical advantage, and could emulate shooting at aircraft in situations where it would be unrealistic or impermissible with a real missile. In this exemplary embodiment, during normal training usage the MAST operator must obtain a LOCK condition with virtual acquisition window 20 before being permitted to fire the stimulus, meaning to radiate an exemplary threat signature.

In an exemplary embodiment, virtual acquisition window 20 may be a manually activated window that the operator uses to designate a target for seeker acquisition. It should be noted that the window in FIG. 6 appears offset for visual clarity, but in actuality may be centered on the aim-point reticle 19.

In an exemplary embodiment, when the stimulus mode is first activated, both the virtual acquisition window 20 and the passive ranging estimate 21 may be turned off. Virtual acquisition window 20 may then be activated when the operator depresses the seeker acquire button 13 on the control grip 7. The window 20 may appear as a small square, centered on the center dot of the aim-point reticle 19. The window may expand at an increasing rate as long as the operator keeps the seeker acquire button 13 depressed, or until it reaches its maximum limit.

In an exemplary embodiment, virtual acquisition window 20 is a square, with dimensions of ±D pixels in azimuth (az) and elevation (el). The azimuth and elevation may provide coordinates in a rectilinear display system, though any other system and corresponding coordinates may be used. For the present example, the window may expand at a non-linear rate, in accordance with the following equation:

$$D = D_{min} + R_0 \cdot t + 0.5 \cdot \alpha \cdot t^2$$

In the above equation, $D_{min}$ is the initial half-width of the window, in pixels; $R_0$ is the initial rate of expansion, in pixels per second; $\alpha$ is acceleration, in pixels per second squared; t is the time, in seconds, the seeker acquire button 13 has been depressed;

In an exemplary embodiment, the operator uses the expanding virtual acquisition window 20 to just bracket the physical extent of the target. The operator may allow it to expand until it is as large as the largest projected target dimension, then releases the seeker acquire button 13 to freeze the window. By doing so, the operator has both designated the region in the video scene where the target resides, inside the acquisition window, and measured the angle, θ, that is subtended by the largest projected target dimension.

Accordingly, in the exemplary embodiment the following equation applies:

$$\theta(mR) = 2 \cdot D(pixels) \cdot P(mR/pixel)$$

In the above equation, D is the largest dimension of the pixel; P represents the pixel weight, a subtended angle for each of the pixels representing a function of the relevant zoom state of the imaging device; and θ (mR) (for example, in radians) is the angle subtended by the largest dimension (D) of the target.

In an exemplary embodiment, when the seeker acquire button 13 is released, virtual acquisition window 20 freezes and passive range estimate 21 is turned on. The range estimate display may compute an estimated range for each of 5 target size classes, for example L=50 feet, 75 feet, 100 feet, 150 feet and/or 225 feet. The operator may designate the target size of interest by highlighting a particular size line in the display. The range estimate from the highlighted line is the range used for automatic profile selection. However, the range estimates from all size lines may be displayed in video, so the engagement range can be determined for the AAR, even when the wrong target size class was selected.

The range of the target may then be computed as follows, with a conversion factor 0.3048 for conversion from feet to kilometers in metric system:

$$Range(Km) = 0.3048 \cdot L(ft)/\theta(mR)$$

In an exemplary embodiment, virtual acquisition window 20, as described above, may be white in color when it is expanding and when the seeker acquire button 13 is first released. As soon as the seeker acquire button 13 is released, the window freezes, and the passive ranging estimate is displayed. The first video frame after the seeker acquire button 13 is released is analyzed to determine if there is sufficient contrast between the target and the background to declare a seeker LOCK condition.

In an exemplary embodiment, the process for determining if contrast is sufficient is summarized as follows:

(1) Compute the average background estimate (denoted Bkgrd_Ave): The value of each pixel that lies just outside the acquisition window (for example, square that is 1 or a few pixels wide, just outside the window dimensions) is summed up and divided by the total number of summed pixels to give an average background value.

(2) Compute average foreground estimate (denoted Fgrd_Ave): The value of each pixel inside the Acquisition Window is summed up and divided by the total number of summed pixels to give an average foreground value.

(3) Compute contrast ratio as follows: Contrast=(Fgrd_Ave)/(Bkgrd_Ave).

(4) Compare the contrast ratio to a threshold value. If the contrast ratio is greater than the threshold value (Contrast>Threshold), the LOCK may be declared (LOCK=True). Otherwise (Else) the LOCK is declared unsuccessful (LOCK=False). A default threshold may be set. For example, the default threshold may be given a preexisting value (Default Threshold=1.2).

In an exemplary embodiment, if the seeker LOCK test fails, the static virtual acquisition window 20 and the passive range estimate 21 are displayed for a period of time, such as 3 seconds. The virtual acquisition window 20 may remain white, with no audio tone being generated, and the ASE stimulus unit 5 may be disabled if the set-up indicates a lock condition is a pre-requisite to firing. After the time period, for example the 3 seconds, both the virtual acquisition window 20 and passive range estimate 21 may be turned off, and the operator may once again try to acquire the target.

In an exemplary embodiment, if the seeker LOCK test is successful, a LOCK condition is declared. The acquisition window 21 may turn red and begin to flash rapidly. An amplitude modulated (AM) signal, for example a 1 KHz AM tone, may be generated in the audio output, and the ASE stimulus unit 5 may be enabled to fire if the state is armed. The display and tone may continue for the 3 seconds, during which the stimulus may be fired.

In this exemplary embodiment, if MAST 26 is not fired during the 3-second LOCK status indication, virtual acquisition window 20, passive ranging estimate 21 and the audio tone may be turned off, and the LOCK condition may be reset to False. On the other hand, if MAST 26 is fired, at the completion of the 3-second LOCK status indication, the audio tone will stop, but the virtual acquisition window 20 and passive range estimate 21 will be held until the ASE stimulus unit 5 has completed radiating the stimulus profile. The virtual acquisition window 20 will stop flashing and turn to a static red square for the duration of the stimulus profile.

In an exemplary embodiment, the automatic profile selection is keyed to the passive range estimate 21 produced by the virtual seeker 20. The auto-selection scheme may assume that there is a list of stored profiles, each with an associated optimum range parameter. Once a passive range estimate is obtained, the auto-selection algorithm simply chooses, from the list of options, the entry for which the optimum range is the closest fit to the measured range estimate.

Exemplary Communications Embodiments

Figure 7:
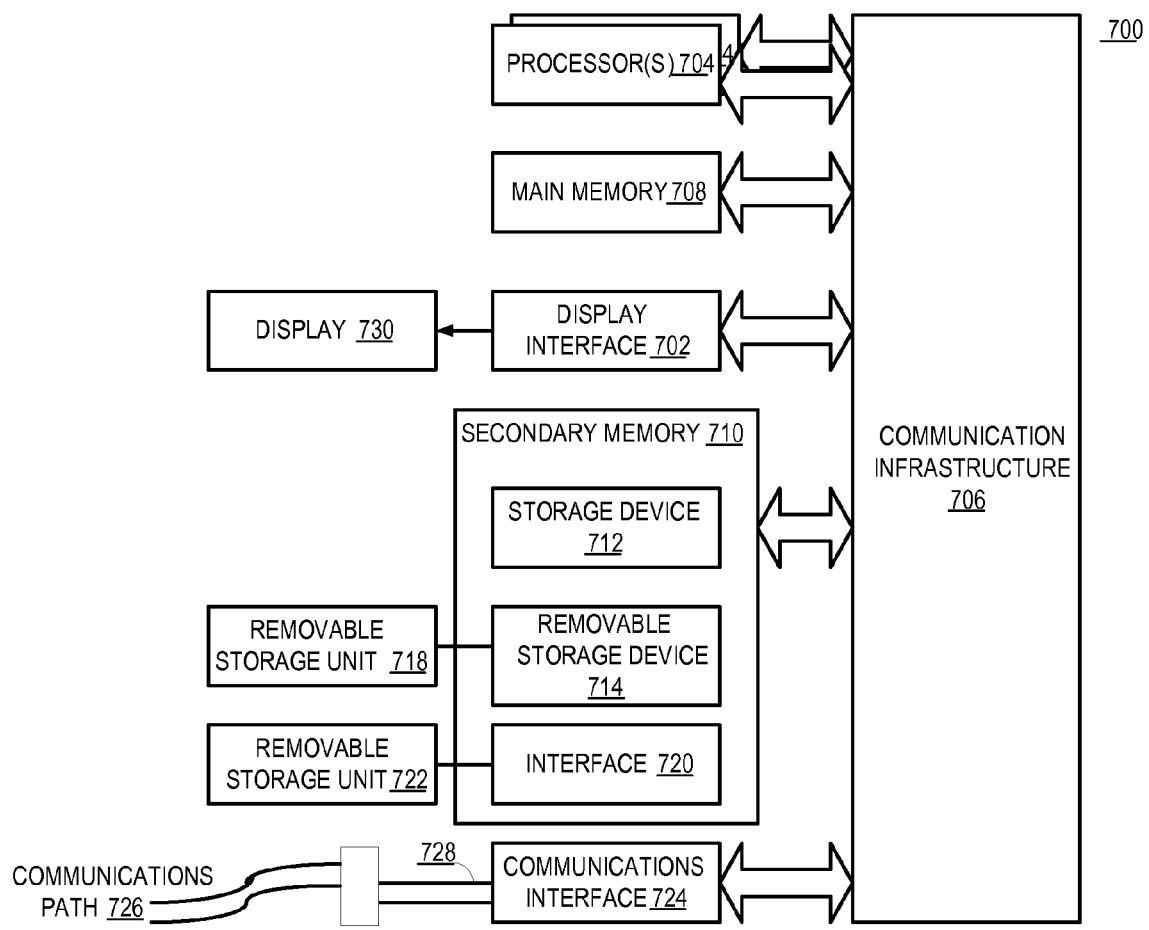
FIG. 7 depicts an exemplary embodiment of a computer system that may be used in association with, in connection with, and/or in place of certain components in accordance with the present embodiments.

FIG. 7 depicts an exemplary embodiment of a computer system 700 that may be used in association with, in connection with, and/or in place of, but not limited to, any of the foregoing components and/or systems. In an exemplary embodiment, the computer system represents an implementation of one or more of the components of FIG. 2.

The present embodiments (or any part(s) or function(s) thereof) may be implemented using hardware, software, firmware, or a combination thereof and may be implemented in one or more computer systems or other processing systems. In fact, in one exemplary embodiment, the invention may be directed toward one or more computer systems capable of carrying out the functionality described herein. An example of a computer system 700 is shown in FIG. 7, depicting an exemplary embodiment of a block diagram of an exemplary computer system useful for implementing the present invention. Specifically, FIG. 7 illustrates an example computer 700, which in an exemplary embodiment may be, e.g., (but not limited to) a personal computer (PC) system running an operating system such as, e.g., (but not limited to) WINDOWS MOBILE™ for POCKET PC, or MICROSOFT® WINDOWS® NT/98/2000/XP/CE/Vista/Windows 7/etc. available from MICROSOFT® Corporation of Redmond, Wash., U.S.A., SOLARIS® from SUN® Microsystems of Santa Clara, Calif., U.S.A., OS/2 from IBM® Corporation of Armonk, N.Y., U.S.A., Mac/OS from APPLE® Corporation of Cupertino, Calif., U.S.A., etc., or any of various versions of UNIX® (a trademark of the Open Group of San Francisco, Calif., USA) including, e.g., LINUX®, HPUX®, IBM AIX®, and SCO/UNIX®, etc. However, the invention may not be limited to these platforms. Instead, the invention may be implemented on any appropriate computer system running any appropriate operating system. In one exemplary embodiment, the present invention may be implemented on a computer system operating as discussed herein. An exemplary computer system, computer 700 is shown in FIG. 7. Other components of the invention, such as, e.g., (but not limited to) a computing device, a communications device, a telephone, a personal digital assistant (PDA), a personal computer (PC), a handheld PC, a laptop, a netbook, an iPad™, client workstations, thin clients, thick clients, proxy servers, network communication servers, remote access devices, client computers, server computers, routers, web servers, data, media, audio, video, telephony or streaming technology servers, etc., may also be implemented using a computer such as that shown in FIG. 7.

The computer system 700 may include one or more processors, such as, e.g., but not limited to, processor(s) 704. The processor(s) 704 may be connected to a communication infrastructure 706 (e.g., but not limited to, a communications bus, cross-over bar, or network, etc.). Various exemplary software embodiments may be described in terms of this exemplary computer system. After reading this description, it will become apparent to a person skilled in the relevant art(s) how to implement the invention using other computer systems and/or architectures.

Computer system 700 may include a display interface 702 that may forward, e.g., but not limited to, graphics, text, and other data, etc., from the communication infrastructure 706 (or from a frame buffer, etc., not shown) for display on the display unit 730.

The computer system 700 may also include, e.g., but may not be limited to, a main memory 708, random access memory (RAM), and a secondary memory 710, etc. The secondary memory 710 may include, for example, (but not limited to) a hard disk drive 712 and/or a removable storage drive 714, representing a floppy diskette drive, a magnetic tape drive, an optical disk drive, a compact disk drive CD-ROM, a DVD, BlueRay™, etc. The removable storage drive 714 may, e.g., but not limited to, read from and/or write to a removable storage unit 718 in a well known manner. Removable storage unit 718, also called a program storage device or a computer program product, may represent, e.g., but not limited to, a floppy disk, magnetic tape, optical disk, compact disk, etc. which may be read from and written to by removable storage drive 714. As will be appreciated, the removable storage unit 718 may include a computer usable storage medium having stored therein computer software and/or data.

In alternative exemplary embodiments, secondary memory 710 may include other similar devices for allowing computer programs or other instructions to be loaded into computer system 700. Such devices may include, for example, a removable storage unit 722 and an interface 720. Examples of such may include a program cartridge and cartridge interface (such as, e.g., but not limited to, those found in video game devices), a removable memory chip (such as, e.g., but not limited to, an erasable programmable read only memory (EPROM), or programmable read only memory (PROM) and associated socket, and other removable storage units 722 and interfaces 720, which may allow software and data to be transferred from the removable storage unit 722 to computer system 700.

Computer 700 may also include an input device such as, e.g., (but not limited to) a mouse or other pointing device such as a digitizer, a touchscreen, a keyboard or other data entry device (none of which are labeled).

Computer 700 may also include output devices, such as, e.g., (but not limited to) display 730, and display interface 702. Computer 700 may include input/output (I/O) devices such as, e.g., (but not limited to) communications interface 724, cable 728 and communications path 726, etc. These devices may include, e.g., but not limited to, a network interface card, and modems (neither are labeled). Communications interface 724 may allow software and data to be transferred between computer system 700 and external devices. Examples of communications interface 724 may include, e.g., but may not be limited to, a modem, a network interface (such as, e.g., an Ethernet card), a communications port, a Personal Computer Memory Card International Association (PCMCIA) slot and card, etc. Software and data transferred via communications interface 724 through data 728 which may include electronic, electromagnetic, optical and/or other means capable of being received by communications interface 724. Data 728 may be provided to communications interface 724 via, e.g., but not limited to, a communications path 726 (e.g., but not limited to, a channel). This channel 726 may carry data 728, which may include, e.g., but not limited to, propagated radiation, and may be implemented using, e.g., but not limited to, wire or cable, fiber optics, a telephone line, a cellular link, an radio frequency (RF) link and/or other communications channels, etc.

In this document, the terms "computer program medium" and "computer readable medium" may be used to generally refer to media such as, e.g., but not limited to removable storage drive 714, a hard disk installed in hard disk drive 712, and data 728, etc. These computer program products may provide software to computer system 700. The invention may be directed to such computer program products.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic data capable of being stored, transferred, combined, compared, and otherwise manipulated. It has proven convenient at times, principally for reasons of common usage, to refer to this data as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In a similar manner, the term "processor" may refer to any device or portion of a device that processes electronic data from registers and/or memory to transform that electronic data into other electronic data that may be stored in registers and/or memory. A "computing platform" may comprise one or more processors.

Embodiments of the present invention may include apparatuses for performing the operations herein. An apparatus may be specially constructed for the desired purposes, or it may comprise a general purpose device selectively activated or reconfigured by a program stored in the device.

Embodiments of the invention may be implemented in one or a combination of hardware, firmware, and software. Embodiments of the invention may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated data (via, e.g., carrier waves, infrared, digital means, etc.), and others.

Computer programs (also called computer control logic), may include object oriented computer programs, and may be stored in main memory 708 and/or the secondary memory 710 and/or removable storage units 714, also called computer program products. Such computer programs, when executed, may enable the computer system 700 to perform the features of the present invention as discussed herein. In particular, the computer programs, when executed, may enable the processor 704 to provide a method to resolve conflicts during data synchronization according to an exemplary embodiment of the present invention. Accordingly, such computer programs may represent controllers of the computer system 700.

In another exemplary embodiment, the invention may be directed to a computer program product comprising a computer readable medium having control logic (computer software) stored therein. The control logic, when executed by the processor 704, may cause the processor 704 to perform the functions of the invention as described herein. In another exemplary embodiment where the invention may be implemented using software, the software may be stored in a computer program product and loaded into computer system 700 using, e.g., but not limited to, removable storage drive 714, hard drive 712 or communications interface 724, etc. The control logic (software), when executed by the processor 704, may cause the processor 704 to perform the functions of the invention as described herein. The computer software may run as a standalone software application program running atop an operating system, or may be integrated into the operating system.

In yet another embodiment, the invention may be implemented primarily in hardware using, for example, but not limited to, hardware components such as application specific integrated circuits (ASICs), or one or more state machines, etc. Implementation of the hardware state machine so as to perform the functions described herein will be apparent to persons skilled in the relevant art(s).

In another exemplary embodiment, the invention may be implemented primarily in firmware.

In yet another exemplary embodiment, the invention may be implemented using a combination of any of, e.g., but not limited to, hardware, firmware, and software, etc.

The exemplary embodiment of the present invention makes reference to wired, or wireless networks. Wired networks include any of a wide variety of well known means for coupling voice and data communications devices together. A brief discussion of various exemplary wireless network technologies that may be used to implement the embodiments of the present invention now are discussed. The examples are non-limited. Exemplary wireless network types may include, e.g., but not limited to, code division multiple access (CDMA), spread spectrum wireless, orthogonal frequency division multiplexing (OFDM), 1G, 2G, 3G wireless, Bluetooth, Infrared Data Association (IrDA), shared wireless access protocol (SWAP), "wireless fidelity" (Wi-Fi), WIMAX, and other IEEE standard 802.11-compliant wireless local area network (LAN), 802.16-compliant wide area network (WAN), and ultrawideband (UWB), etc.

Bluetooth is an emerging wireless technology promising to unify several wireless technologies for use in low power radio frequency (RF) networks.

IrDA is a standard method for devices to communicate using infrared light pulses, as promulgated by the Infrared Data Association from which the standard gets its name. Since IrDA devices use infrared light, they may depend on being in line of sight with each other.

The exemplary embodiments of the present invention may make reference to WLANs. Examples of a WLAN may include a shared wireless access protocol (SWAP) developed by Home radio frequency (HomeRF), and wireless fidelity (Wi-Fi), a derivative of IEEE 802.11, advocated by the wireless Ethernet compatibility alliance (WECA). The IEEE 802.11 wireless LAN standard refers to various technologies that adhere to one or more of various wireless LAN standards. An IEEE 802.11 compliant wireless LAN may comply with any of one or more of the various IEEE 802.11 wireless LAN standards including, e.g., but not limited to, wireless LANs compliant with IEEE std. 802.11a, b, d or g, such as, e.g., but not limited to, IEEE std. 802.11a, b, d and g, (including, e.g., but not limited to IEEE 802.11g-2003, etc.), etc.

CONCLUSION

While various embodiments of the present invention have been described above, it should be understood that they have been presented by way of example only, and not limitation. Thus, the breadth and scope of the present invention should not be limited by any of the above-described exemplary embodiments, but should instead be defined only in accordance with the following claims and their equivalents.

What is claimed is:

1. A method for simulating the signature of a missile threat, comprising: displaying, by a processor, a video scene on a graphical user interface (GUI) of an imaging device, the video scene including a target at an unknown range;
adjusting, by the processor, an acquisition window within the GUI to fit the target, wherein the acquisition window expands at a non-linear rate within the GUI to fit the target in response to a user actuating a control for a length of time;
determining, by the processor, an angle subtended by the largest dimension of the target based on the acquisition window in response to the user actuating the control;
determining, by the processor, a largest dimension of the target based on received user input after the user actuates the control;
estimating, by the processor, the range of the target from the largest dimension of the target and the angle subtended by the largest dimension of the target viewed from the acquisition window;
determining, by the processor, an electromagnetic emission profile of a missile plume from a launched missile based on the estimated range to the target; and
radiating electromagnetic energy having characteristics emulating a missile threat signature based on the determined electromagnetic emission profile of the missile plume.

2. The method according to claim 1, wherein the acquisition window comprises a square having dimension (D) in pixels in the azimuthal direction and dimension (D) in pixels in the elevation direction on the GUI.

3. The method according to claim 2, wherein the acquisition window expands according to the dimension $(D)=D_{min}+R_0 \cdot T+0.5 \cdot \alpha \cdot T^2$, wherein (a) $D_{min}$ is the initial half-width of the window, in pixels, (b) $R_0$ is the initial rate of expansion of the acquisition window, in pixels per second, (c) $\alpha$ is the acceleration of expansion of the acquisition window, in pixels per second squared, and T is the time, in seconds, the user actuates the control.

4. The method according to claim 1, wherein the angle subtended by the largest dimension of the target is based on the dimension (D) in pixels of the acquisition window and a pixel weight being a subtended angle for each of said pixels representing a function of the relevant zoom state of the imaging device.

5. The method according to claim 4, wherein the angle subtended by the largest dimension of the target $(\theta)=2 \cdot D \cdot P$, where dimension D is the dimension in pixels of the acquisition window, and P is the pixel weight.

6. The method according to claim 1, wherein the range is estimated by dividing the largest dimension of the target by the angle subtended by the largest dimension of the target.

7. The method according to claim 1, wherein the electromagnetic emission profile of the missile plume comprises (a) an amplitude representing emission characteristics of the missile plume as a function of (b) the amount of time since the launching of the missile.

8. The method according to claim 2, further comprising: locking the imaging device onto the target.

9. The method according to claim 8, wherein the locking of the imaging device onto the target is computed from an average foreground pixel intensity level of the acquisition window and an average background pixel intensity level outside the acquisition window.

10. The method according to claim 9, further comprising: (a) computing the average foreground pixel intensity level as the average intensity level of the plurality of pixels within the acquisition window; (b) computing the average background pixel intensity level as the average intensity level of any number of pixels outside the acquisition window; (c) computing a contrast ratio by dividing the average foreground pixel intensity level by the average background pixel intensity level; and (d) determining the target to be locked if the contrast ratio exceeds a predetermined threshold level.

11. A system simulating the signature of a missile threat, comprising:

an imaging device, the imaging device including a graphical user interface (GUI) displaying a video scene, the video scene including a target at an unknown range;

a device for adjusting an acquisition window within the GUI to fit the target, wherein the acquisition window expands at a non-linear rate within the GUI to fit the target in response to a user actuating a control for a length of time;

a device for determining an angle subtended by the largest dimension of the target based on the acquisition window in response to the user actuating the control;

a device for determining a largest dimension of the target based on received user input after the user actuates the control;

a device for estimating the range of the target from the largest dimension of the target and the angle subtended by the largest dimension of the target viewed from the acquisition window;

a device for determining an electromagnetic emission profile of a missile plume from a launched missile based on the estimated range to the target; and a device for radiating electromagnetic energy having characteristics emulating a missile threat signature based on the determined electromagnetic emission profile of the missile plume.

12. The system according to claim 11, wherein the acquisition window comprises a square having dimension (D) in pixels in the azimuthal direction and dimension (D) in pixels in the elevation direction on the GUI.

13. The system according to claim 11, wherein the angle subtended by the largest dimension of the target is based on the dimension (D) in pixels of the acquisition window and a pixel weight being a subtended angle for each of said pixels representing a function of the relevant zoom state of the imaging device.

14. The system according to claim 13, wherein the angle subtended by the largest dimension of the target $\theta = 2 \cdot D \cdot P$, where dimension D is the dimension in pixels of the acquisition window, and P is the pixel weight.

15. The system according to claim 11, wherein the range is estimated by dividing the largest dimension of the target by the angle subtended by the largest dimension of the target.

16. The system according to claim 11, wherein the electromagnetic emission profile of the missile plume comprises (a) an amplitude representing emission characteristics of the missile plume as a function of (b) the amount of time since the launching of the missile.

17. The system according to claim 12, further comprising: device for locking the imaging device onto the target.

18. The system according to claim 17, wherein the locking of the imaging device onto the target is computed from an average foreground pixel intensity level of the acquisition window and an average background pixel intensity level outside the acquisition window.

19. The system according to claim 18, further comprising: (a) device for computing the average foreground pixel intensity level as the average intensity level of the plurality of pixels within the acquisition window; and (b) device for computing the average background pixel intensity level as the average intensity level of any number of pixels outside the acquisition window.

20. The system according to claim 19, further comprising: (c) device for computing a contrast ratio by dividing the average foreground pixel intensity level by the average background pixel intensity level.

21. The system according to claim 20, further comprising: (d) device for determining the target to be locked if the contrast ratio exceeds a predetermined threshold level.

22. The system according to claim 11, wherein the system comprises at least one of: a man-portable aircraft survivability equipment (ASE) system trainer (MAST); and a simulator simulating a man-portable air defense system (MANPADS).

23. A machine-readable medium that provides instructions, which when executed by a computing platform, causes the computing platform to perform operations for simulating the signature of a missile threat, the instructions comprising:

displaying a video scene on a graphical user interface (GUI) of an imaging device, the video scene including a target at an unknown range;

adjusting an acquisition window within the GUI to fit the target, wherein the acquisition window expands at a non-linear rate within the GUI to fit the target in response to a user actuating a control for a length of time;

determining an angle subtended by the largest dimension of the target based on the acquisition window in response to the user actuating the control;

determining a largest dimension of the target based on received user input after the user actuates the control;

estimating the range of the target from the largest dimension of the target and the angle subtended by the largest dimension of the target viewed from the acquisition window;

determining an electromagnetic emission profile of a missile plume from a launched missile based on the estimated range to the target; and radiating electromagnetic energy having characteristics emulating a missile threat signature based on the determined electromagnetic emission profile of the missile plume.

* * * * *